(12) United States Patent
Park

(10) Patent No.: US 8,761,226 B2
(45) Date of Patent: Jun. 24, 2014

(54) CONNECTION UNIT AND LASER OSCILLATING APPARATUS HAVING THE SAME

(75) Inventor: Ki-Woon Park, Yongin (KR)

(73) Assignee: Samsung Display Co., Ltd., Guheung-Gu, Yongin, Gyeonggi-Do (KR)

( * ) Notice: Subject to any disclaimer, the term of this patent is extended or adjusted under 35 U.S.C. 154(b) by 233 days.

(21) Appl. No.: 12/868,533

(22) Filed: Aug. 25, 2010

(65) Prior Publication Data

US 2011/0051757 A1 Mar. 3, 2011

(30) Foreign Application Priority Data

Aug. 27, 2009 (KR) .................... 10-2009-0080042

(51) Int. Cl.
*H01S 3/22* (2006.01)
*H01S 3/08* (2006.01)

(52) U.S. Cl.
USPC ............................ 372/108; 372/55; 372/57

(58) Field of Classification Search
None
See application file for complete search history.

(56) References Cited

U.S. PATENT DOCUMENTS

| | | | | |
|---|---|---|---|---|
| 3,836,236 A | * | 9/1974 | Kirk et al. | 372/107 |
| 3,921,100 A | * | 11/1975 | Olinger et al. | 372/108 |
| 4,862,886 A | * | 9/1989 | Clarke et al. | 372/108 |
| 6,895,030 B1 | | 5/2005 | Hayashikawa et al. | |
| 6,943,086 B2 | * | 9/2005 | Hongo et al. | 372/92 |

FOREIGN PATENT DOCUMENTS

| | | |
|---|---|---|
| JP | 63-260021 | 10/1988 |
| JP | 06-160187 A | 6/1994 |
| JP | 09219555 | 8/1997 |
| JP | 10-301153 A | 11/1998 |
| JP | 11-298693 | 10/1999 |
| JP | 2000214402 | 8/2000 |
| JP | 2002-118077 A | 4/2002 |
| JP | 2003066357 | 3/2003 |
| JP | 2003-100602 | 4/2003 |
| JP | 2003-124136 | 4/2003 |
| JP | 2003218432 | 7/2003 |
| KR | 1020050061006 | 6/2005 |
| KR | 1020070111305 A | 11/2007 |

* cited by examiner

*Primary Examiner* — Armando Rodriguez
*Assistant Examiner* — Sean Hagan
(74) *Attorney, Agent, or Firm* — Robert E. Bushnell, Esq.

(57) ABSTRACT

A laser oscillation device includes an oscillation unit oscillating a laser, a shutter unit covering the laser, and a connection unit covering the laser, connecting the oscillation unit and the shutter unit and including a first connection part supported by the oscillation unit and a second connection part supported by the shutter unit. The first and second connection parts are separated from each other, and one of the first and second connection parts covers at least a portion of the other one of the first and second connection parts.

9 Claims, 6 Drawing Sheets

CONNECTION UNIT AND LASER OSCILLATING APPARATUS HAVING THE SAME

CLAIM OF PRIORITY

This application makes reference to, incorporates into this specification the entire contents of, and claims all benefits accruing under 35 U.S.C. §119 from an application earlier filed in the Korean Intellectual Property Office on Aug. 27, 2009, and there duly assigned Serial No. 10-2009-0080042.

BACKGROUND OF THE INVENTION

1. Field of the Invention

The described technology relates generally to a laser oscillation apparatus, and more particularly, to a connection unit covering a laser and a laser oscillating apparatus having the same.

2. Description of the Related Art

To display images, various flat panel display devices such as a liquid crystal display (LCD) device, an organic light emitting diode (OLED) display device, and the like, replacing the conventional Braun tubes, namely, cathode ray tubes (CRTs), are in use.

SUMMARY OF THE INVENTION

It is therefore an aspect of the present invention to provide an improved laser oscillation device.

It is another aspect of the present invention to provide a connection unit having advantages of restraining vibration caused by laser oscillation from being transferred to an optical unit, and a laser oscillation device having the same.

It is still another aspect of the present invention to provide a connection having advantages of restraining damage to a shutter unit by lessening mechanical stress transferred to the shutter unit.

According to one aspect of the present invention, a laser oscillation device including an oscillation unit oscillatting a laser, a shutter unit covering the laser, and a connection unit covering the laser, connecting the oscillation unit and the shutter unit, and including a first connection part supported by the oscillation unit and a second connection part supported by the shutter unit. The first and second connection parts are separated from each other, and one of the first and second connection parts covers at least a portion of the other one of the first and second connection parts.

The laser oscillation device may further include an optical unit connected with the shutter unit and changing a light path of the laser.

The laser oscillation device may further include a first support supporting the oscillation unit and a second support supporting at least one of the shutter unit and the optical unit. The first and second supports may be separated from each other.

The first and second connection parts may have shapes that structurally correspond to each other.

The first connection part may include a first extension portion extending in a first cylindrical shape from the oscillation unit toward the shutter unit. The second connection part may include a second extension portion extending from the shutter unit to an interior of the first extension portion, and having a second cylindrical shape with a smaller diameter than that of the first extension portion in the first cylindrical shape.

The first connection part may further include a first bent portion bent to extend from an end portion of the first extension portion toward the second extension portion. The second connection part may further include a second bent portion bent to extend from an end portion of the second extension portion toward the first extension portion. The first and second bent portions may face each other.

Alternatively, the first connection part may include a third extension portion extending in a third cylindrical shape from the oscillation unit toward the shutter unit. The second connection part may include a fourth extension portion extending from the shutter unit to the third extension portion to cover the third extension portion and having a fourth cylindrical shape with a larger diameter than that of the third extension portion in the third cylindrical shape.

The first connection part may further include a third bent portion bent to extend from an end portion of the third extension portion toward the fourth extension portion. The second connection part may further include a fourth bent portion bent to extend from an end portion of the fourth extension portion toward the third extension portion. The third and fourth bent portions may face each other.

The first and second connection parts may extend in a stepwise fashion.

The laser may be an excimer layer.

The laser may be used to crystallize silicon.

According to one aspect of the present invention, a connection unit is provided to connect an oscillation unit oscillating a laser and a shutter unit covering the laser. The connection unit may include a first connection part supported by the oscillation unit and a second connection part supported by the shutter unit. The first and second connection parts are separated from each other, and one of the first and second connection parts covers at least a portion of the other one of the first and second connection parts.

Because the connection unit and the laser oscillation device having the same includes the first and second connection parts, the transfer of vibration caused by laser oscillation to the optical unit can be suppressed.

In addition, because the connection unit and the laser oscillation device having the same includes the first and second connection parts, mechanical stress transferred to the connection unit or to the shutter unit can be lessened, thus restraining damage to the shutter unit.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
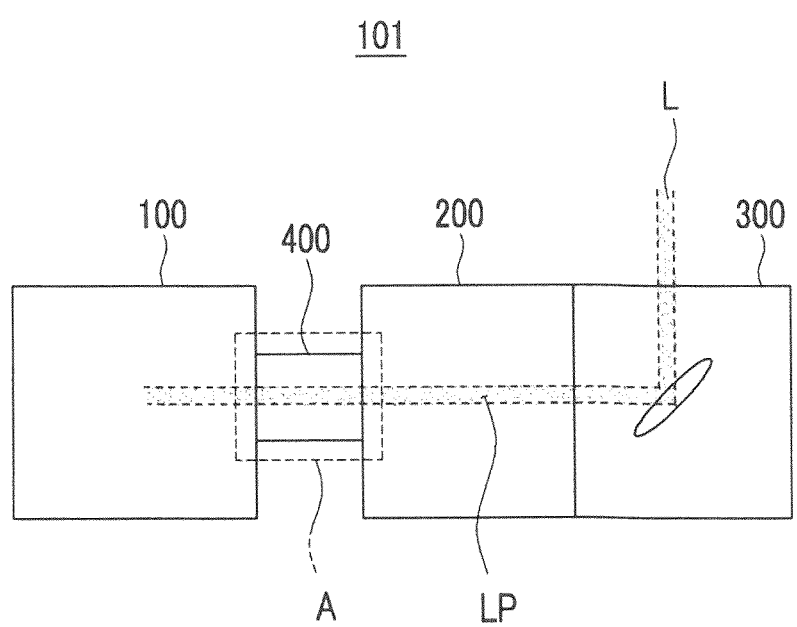
FIG. 1 is a schematic view of a laser oscillation device constructed as a first exemplary embodiment according to the principles of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In describing multiple exemplary embodiments, elements having the same configuration will be described representatively by using the same reference numerals in a first exemplary embodiment, and only different configurations from those of the first exemplary embodiment will be described in other exemplary embodiments.

In order to clarify the present invention, parts that are not connected with the description will be omitted, and the same elements or equivalents are referred to by the same reference numerals throughout the specification.

The size and thickness of each element are arbitrarily shown in the drawings, and the present invention is not necessarily limited thereto.

In the drawings, the thickness of layers, films, panels, regions, etc., are exaggerated for clarity. Also, in the drawings, the thickness of some layers and regions are exaggerated for the sake of brevity. It will be understood that when an element is referred to as being "connected with" another element, it can be directly connected with the other element or intervening elements may also be present.

In the following description, an excimer laser is taken as a laser that is oscillated by a laser oscillation device constructued as an exemplary embodiment. But, the present invention is not meant to be limited thereto, and the laser that is oscillated by the laser oscillation device constructued as an exemplary embodiment may also be a pulse laser, a solid-state laser, and the like.

Also, in the following description, the laser that is oscillated by the laser oscillation device constructued as an exemplary embodiment may be used to crystallize silicon, but the present invention is not meant to be limited thereto, and the layer that is oscillated by the laser oscillation device constructued as an exemplary embodiment may also be used to cut an irradiation subject (i.e., a target to be irradiated), suture irradiation subjects, and harden an irradiation subject.

Flat panel display devices such as the LCD device or OLED display device include thin film transistors (TFTs) as switching elements for controlling the operation of pixels and as driving elements for driving the pixels.

Each TFT has a semiconductor active layer including drain and source regions doped with impurities at a high concentration and a channel region formed between the drain and source regions. The semiconductor active layer may be made of amorphous silicon or polycrystalline silicon.

A TFT using amorphous silicon is desirable because amorphous silicon is available for low temperature deposition but is undesirable because the electrical characteristics and reliability of the amorphous silicon are degraded and because the amouphous silicon is not suitable for the fabrication of a large scale display device. Thus, recently, a TFT using polycrystalline silicon has become more commonly used.

With high current mobility of about hundreds of $cm^2/Vs$, high frequency operating characteristics, and a low leakage current value, polycrystalline silicon is highly suitable for the mass fabrication of high-definition and large-scale flat panel display device.

Such polycrystalline silicon is fabricated by crystallizing amorphous silicon, for which a laser annealing method that irradiates a laser on a thin film substrate is employed.

Damage to the substrate under a thin film can be advantageously minimized because the crystallization of amorphous silicon by laser is done through a low-temperature process. An excimer laser is commonly used in the laser annealing method.

In the low-temperature poly-crystallizing method using an excimer laser, amorphous silicon is polycrystallized within an annealing chamber by irradiating an excimer layer generated by a laser oscillation device to the amorphous silicon thin film.

A laser oscillation device includes an oscillation unit for oscillating the laser, a shutter unit for restraining external leakage of the laser oscillated from the oscillation unit, and an optical unit for changing a light path of the laser that has passed through the shutter unit. In the laser oscillation device, the oscillation unit, the shutter unit, and the optical unit are operationally connected with each other.

In the laser oscillation device, however, the oscillation unit that oscillates the laser generates vibration while oscillating the laser, and the vibration generated by the oscillation unit is transferred to the optical unit via the shutter unit connected to the oscillation unit. Thus, because the optical unit is vibrated by the vibration transferred from the oscillation unit, an error is generated which alters the light path of the laser due to the vibrating optical unit, thereby causing a problem because the crystallization of the amorphous silicon is defective.

In addition, because the oscillation unit and the optical unit are connected by the shutter unit, the shutter unit may be damaged due to mechanical stress transferred to the shutter unit by an external impact applied to either to the oscillation unit or the optical unit.

A laser oscillation device 101 constructed as a first exemplary embodiment according to the principles of the present invention will now be described with reference to FIG. 1.

FIG. 1 is a schematic view of a laser oscillation device constructued as the first exemplary embodiment.

As shown in FIG. 1, laser oscillation device 101 constructued as the first exemplary embodiment includes an oscillation unit 100, a shutter unit 200, an optical unit 300, and a connection unit 400.

Oscillation unit 100 oscillates an excimer laser L to be used to crystallize amorphous silicon to make polycrystalline silicon. Oscillation unit 100 includes a laser gas such as Ne, Xe, HCl, and the like therein in order to oscillate excimer laser L. In addition, oscillation unit 100 includes a discharge electrode (not shown) for exciting the laser gas included therein to oscillate laser L. When the discharge electrode within oscillation unit 100 starts discharging, the Ne gas serves as a buffer gas and the Xe and HCl gases serve to generate laser L. Oscillation unit 100 may be supported by a first support (not shown). The first support may be formed either as a mount support on which oscillation unit 100 can be mounted, or as a hook support from which oscillation unit 100 can be suspended.

Oscillation unit 100 is connected with shutter unit 200 with connection unit 400 interposed therebetween.

Shutter unit 200 serves to open and shut laser L oscillated by oscillation unit 100. Also, shutter unit 200 covers laser L such that laser L oscillated from oscillation unit 100 is not exposed. Shutter unit 200 may be supported by a second support (not shown) separated from the first support, or may be supported by optical unit 300. The second support may be formed either as a mount support on which shutter unit 200 can be mounted, or as a hook support from which shutter unit 200 can be suspended. Vibration generated by oscillation unit 100 is not transferred to shutter unit 200 by virtue of connection unit 400 (to be described). Because vibration generated by oscillation unit 100 is not transferred to shutter unit 200, such vibration cannot be transferred to optical unit 300 by the medium of shutter unit 200.

Shutter unit 200 is connected with optical unit 300.

Optical unit 300 includes one or more lenses, one or more reflectors, and the like, and serves to change a light path LP of laser (L) that has passed through shutter unit 200 after being oscillated by oscillation unit 100 to guide laser L to an irradiation subject such as amorphous silicon. Vibration generated by oscillation unit 100 is not transferred to optical unit 300 by virtue of connection unit 400. Because vibration generated by oscillation unit 100 is not transferred to optical unit 300, optical unit 300 can guide laser L, which has been oscillated from oscillation unit 100, to an established path without any problem as a laser guide. Optical unit 300 may be supported by a third support (not shown) separated from the first support, or may be supported by shutter unit 200. The third support may be formed either as a mount support on which optical unit 300 can be mounted, or as a hook support from which optical unit 300 can be suspended.

Connection unit 400 included in the laser oscillation device constructued as the first exemplary embodiment will now be described in detail with reference to FIGS. 2 and 3.

Figure 2:
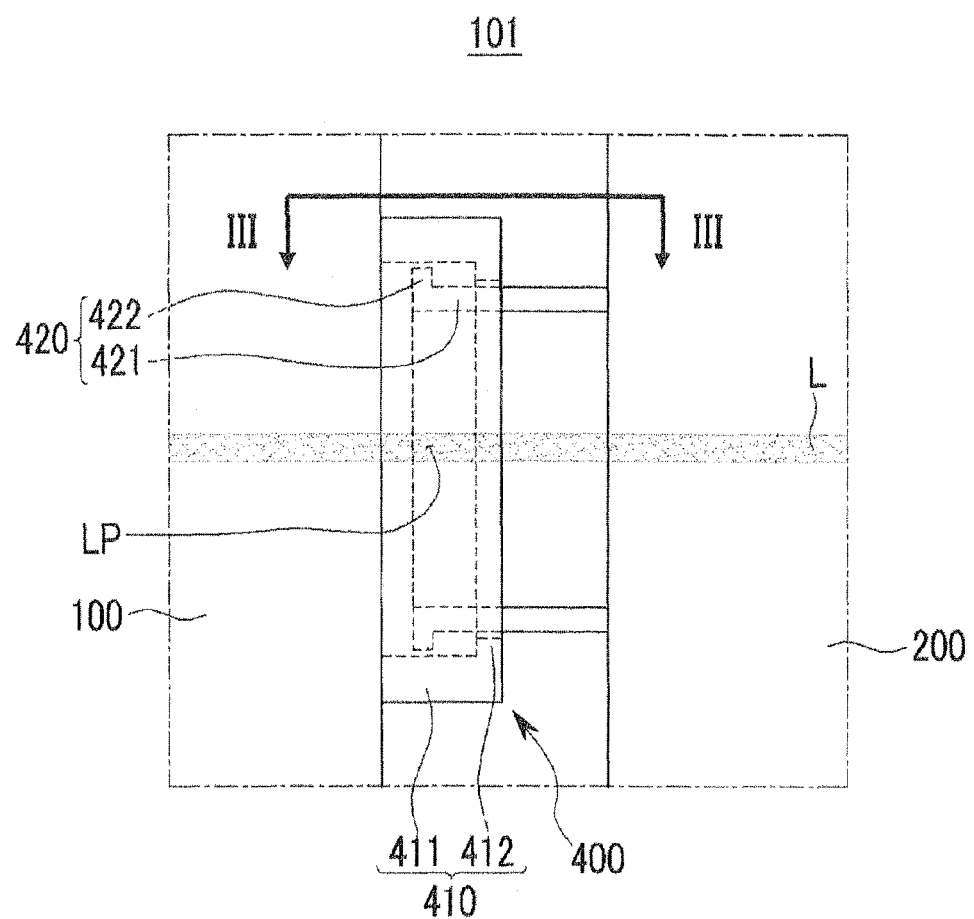
FIG. 2 is an enlarged view of a portion "A" in FIG. 1.

FIG. 2 is an enlarged view of a portion "A" in FIG. 1. FIG. 3 is a cross-sectional view taken along line III-III in FIG. 2.

Figure 3:
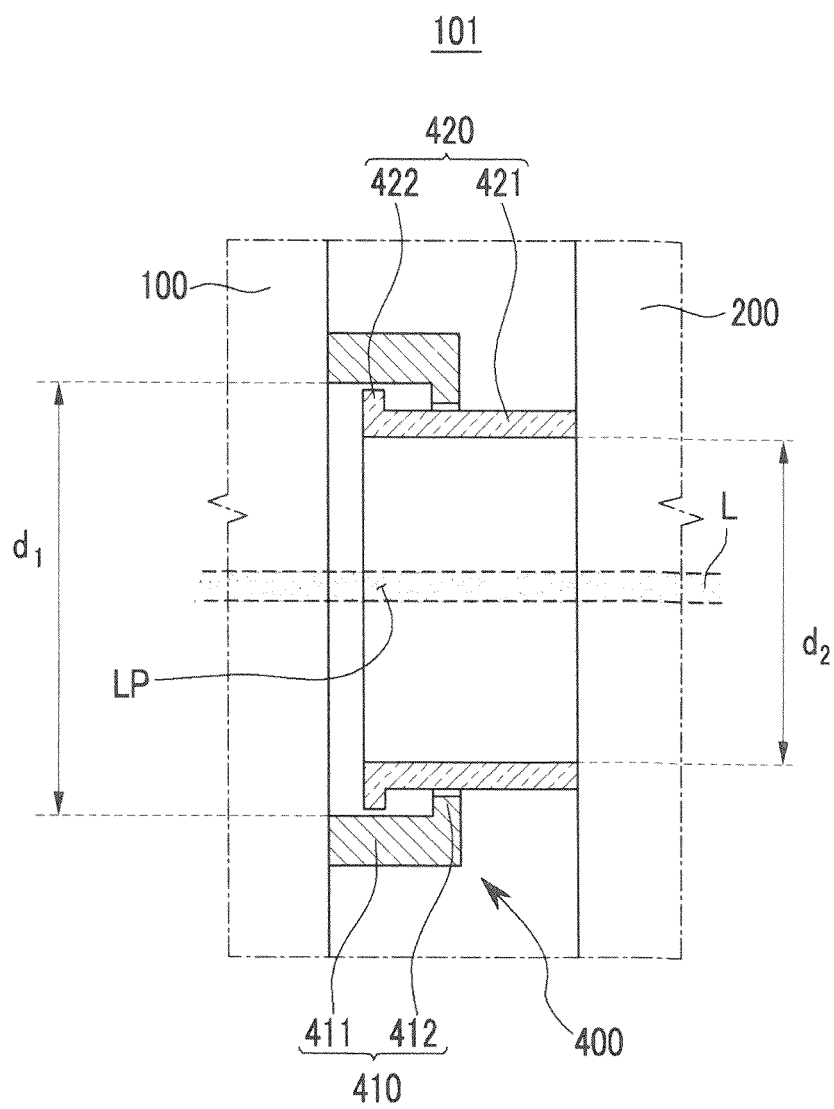
FIG. 3 is a cross-sectional view taken along line III-III in FIG. 2.

As shown in FIGS. 2 and 3, connection unit 400 is positioned between oscillation unit 100 and shutter unit 200. Connection unit 400 covers laser L and includes first and second connection parts 410 and 420.

First connection part 410 is supported by oscillation unit 100 and covers a portion or the entirety of second connection part 420 in a state in which first connection part 410 is separated from second connection part 420. First connection part 410 has a shape that structurally corresponds to that of second connection part 420. First connection part 410 includes a first extension portion 411 and a first bent portion 412.

First extension portion 411 has a first cylindrical shape, is connected with oscillation unit 100, and extends from oscillation unit 100 toward shutter unit 200. The first cylinder of first extension portion 411 has a first diameter $d_1$ that is larger than a second diameter $d_2$ of a second cylinder of second extension portion 421 included in second connection part 420 (to be described). First bent portion 412 is positioned at an end portion of first extension portion 411 at the side of shutter unit 200. That is, first bent portion 412 is closer to shutter unit 200 than first extension portion 411.

First bent portion 412 is bent to extend from the end portion of first extension portion 411 toward second extension portion 421 of second connection part 420. First bent portion 412 is separated by a certain gap from second extension portion 421, and has a hole in which second extension portion 421 is inserted.

Second connection part 420 is supported by shutter unit 200, and a portion or the entirety of second connection part 420 is covered by first connection part 410 in a state in which second connection part 420 is separated from first connection part 410. Second connection part 420 has a shape that structurally corresponds to that of first connection part 410. Second connection part 420 includes a second extension portion 421 and a second bent portion 422.

Second extension portion 421 has a cylindrical shape, is connected with shutter unit 200, and extends from shutter unit 200 toward oscillation unit 100. In more detail, second extension portion 421 extends from shutter unit 200 to an interior of first extension portion 411, so that a portion or the entirety of second extension portion 421 is insertedly positioned within first extension portion 411. The second cylinder of second extension portion 421 has a second diameter $d_2$ that is smaller than first diameter $d_1$ of first extension portion 411 covering second extension portion 421. Second bent portion 422 is positioned at an end portion of second extension portion 421 at the side of oscillation unit 100. That is, second bent portion 422 is closer to oscillation unit 100 than second extension portion 421.

Second bent portion 422 is bent to extend from the end portion of second extension portion 421 toward first extension portion 411 of first extension portion 410. Second bent portion 422 is separated by a certain space from first extension portion 411 and faces first bent portion 412 of first extension portion 411. In more detail, second bent portion 422 of second extension portion 421 directly faces first bent portion 412 of first extension portion 411. In this manner, because second bent portion 422 and first bent portion 412 that are respectively bent from second extension portion 421 and first extension portion 411 directly face each other in the state in which second extension portion 421 is insertedly positioned within first extension portion 411, laser L covered by connection unit 400 is not exposed.

As described above, in laser oscillation device 101 constructued as the first exemplary embodiment, because first connection part 410 covers second connection part 420 in the state of being separated from second connection part 420, and first connection part 410 of connection unit 400 is connected with oscillation unit 100 and second connection part 420 is connected with shutter unit 200, vibration generated when oscillation unit 100 oscillates laser L is transferred only up to first connection part 410, without being transferred to second connection part 420 that is separated from first connection part 410.

That is, vibration generated by oscillation unit 100 is interrupted by connection unit 400, thereby not being transferred to shutter unit 200 connected with connection unit 400, so vibration generated by oscillation unit 100 is prevented from being transferred to optical unit 300 by the medium of shutter unit 200. Accordingly, an error does not occur in the guide of light path LP of laser L that is oscillated by oscillation unit 100, by optical unit 300.

In addition, in laser oscillation device 101 constructued as the first exemplary embodiment, because first and second connection parts 410 and 420 of connection unit 400 are supported by oscillation unit 100 and shutter unit 200, respectively, in the state in which they are separated from each other, first and second connection parts 410 and 420 receive mechanical stress, respectively, only by an external impact applied to oscillation unit 100, shutter unit 200, or optical unit 300. That is, the mechanical stress may be applied to one of first and second connection parts 410 and 420 of connection unit 400, and in this case, the other one of first and second connection parts 410 and 420 is not affected by the mechanical stress. Thus, the mechanical stress transferred to connection unit 400 or to shutter unit 200 can be lessened to restrain damage to connection unit 400 or shutter unit 200.

An experimental example of when the laser oscillation device constructued as the first exemplary embodiment is employed will now be described with reference to FIG. 4.

Figure 4:
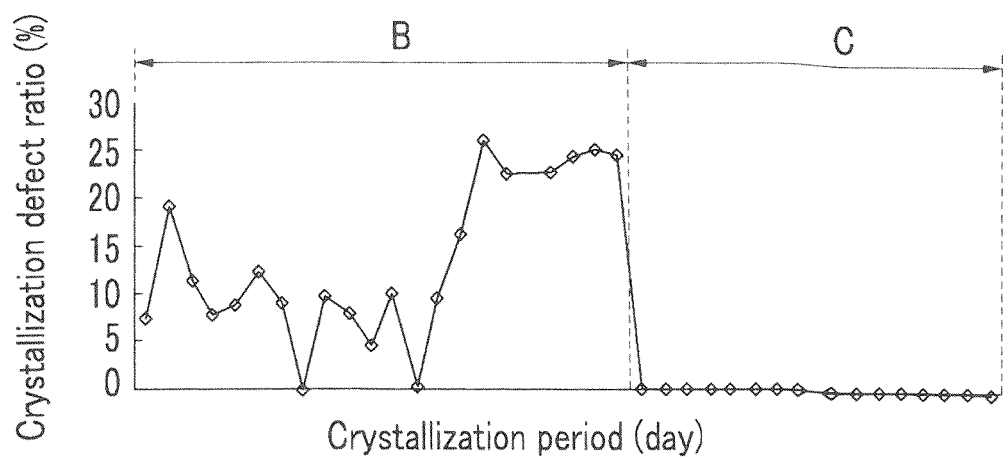
FIG. 4 is a graph showing an experimental example when the laser oscillation device constructed as the first exemplary embodiment according to the principles of the present invention is employed.

FIG. 4 is a graph showing an experimental example of when the laser oscillation device constructued as the first exemplary embodiment was employed.

In FIG. 4, the X axis is a crystallization period during which amorphous silicon was crystallized by using the laser, and the Y axis is a crystallization defect rate obtained after the amorphous silicon was crystallized by using the laser.

In FIG. 4, the area "B" represents a crystallization defect rate obtained when the related art laser oscillation device was used without the connection unit 400, and the area "C" represents a crystallization defect rate obtained when the laser oscillation device including the connection unit 400 constructued as the first exemplary embodiment was used.

As shown in FIG. 4, it is noted that, when amorphous silicon was crystallized by using the related art laser oscillation device in which oscillation unit 100 and shutter 200 are directly connected without connection unit 400, vibration generated by oscillation unit 100 was transferred to optical unit 300, interrupting optical unit 300, thus making the crystallization of amorphous silicon by laser L defective; and as the crystallization period was prolonged, the crystallization defect rate rose continuously, as represented by region "B". Meanwhile, it is noted that, when amorphous silicon was crystallized by using laser oscillation device 101 including connection unit 400 interposed between oscillation unit 100 and shutter unit 200 constructued as the first exemplary embodiment, the crystallization defect rate was drastically reduced.

That is, as shown in FIG. 4, it was noted that connection unit 400 can interrupt vibration generated by oscillation unit 100 to thereby suppress error generation in optical unit 300 due to otherwise transferred vibration.

A laser oscillation device constructed as a second exemplary embodiment according to the principles of the present invention will now be described with reference to FIG. 5.

Figure 5:
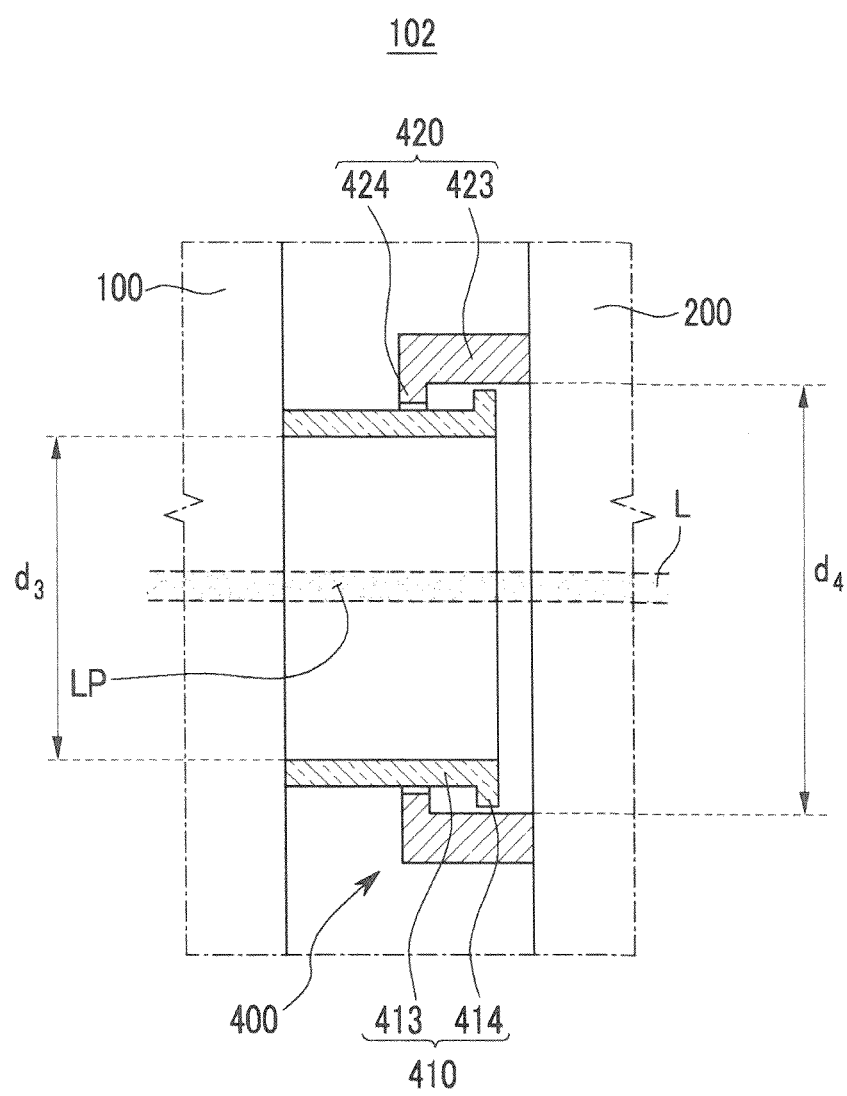
FIG. 5 is a cross-sectional view showing a portion of a laser oscillation device constructed as a second exemplary embodiment according to the principles of the present invention.

FIG. 5 is a cross-sectional view showing a portion of a laser oscillation device constructued as the second exemplary embodiment.

As shown in FIG. 5, connection unit 400 of laser oscillation device 102 constructued as the second exemplary embodiment includes first and second connection parts 410 and 420.

First connection part 410 is supported by oscillation unit 100, and a portion or the entirety of first connection part 410 is covered by second connection part 420 in a state in which first connection part 410 is separated from second connection part 420. First connection part 410 includes a third extension portion 413 and a third bent portion 414.

Third extension portion 413 has a third cylindrical shape, is connected with oscillation unit 100, and extends from oscillation unit 100 toward shutter unit 200. The third cylinder of third extension portion 413 has a third diameter $d_3$ that is smaller than a fourth diameter $d_4$ of a fourth cylinder of a fourth extension portion 423 included in second connection part 420. Third bent portion 414 is positioned at an end portion of third extension portion 413 at the side of shutter unit 200. That is, third bent portion 414 is positioned closer to shutter unit 200 than third extension portion 413.

Third bent portion 414 is bent to extend from the end portion of third extension portion 413 toward fourth extension portion 423 of second connection part 420.

Second connection part 420 is supported by shutter unit 200 and covers a portion or the entirety of first connection part 410 in a state in which second connection part 420 is separated from first connection part 410. Second connection part 420 includes fourth extension portion 423 and a fourth bent portion 424.

Fourth extension portion 423 has a fourth cylindrical shape, is connected with shutter unit 200, and extends from shutter unit 200 toward oscillation unit 100. In more detail, fourth extension portion 423 extends from shutter unit 200 such that third extension portion 413 is positioned at an inner side of fourth extension portion 423, so a portion or the entirety of third extension portion 413 is insertedly positioned at the inner side of fourth extension portion 423. The fourth cylinder of fourth extension portion 423 has a fourth diameter $d_4$ that is larger than third diameter $d_3$ of third extension portion 413 covered by fourth extension portion 423. Fourth bent portion 424 is positioned at an end portion of fourth extension portion 423 at the side of oscillation unit 100.

Fourth bent portion 424 is bent to extend from the end portion of fourth extension portion 423 toward third extension portion 413 of second connection portion 410. Fourth bent portion 424 is separated by a certain gap from third extension portion 413 and faces the third bent portion of third extension portion 413. In more detail, fourth bent portion 424 of fourth extension portion 423 directly faces third bent portion 414 of third extension portion 413. Fourth bent portion 424 is separated by a certain gap from third extension portion 413 and has a hole in which third extension portion 413 is inserted. In this manner, because fourth bent portion 424 and third bent portion 414 that are respectively bent from fourth extension portion 423 and third extension portion 413 directly face each other in the state in which third extension portion 413 is insertedly positioned within fourth extension portion 423, laser L covered by connection unit 400 is not exposed.

As described above, in laser oscillation device 102 constructued as the second exemplary embodiment, because second connection part 420 covers first connection part 410 in the state of being separated from first connection part 410, and first connection part 410 of connection unit 400 is connected with oscillation unit 100 and second connection part 420 is connected with shutter unit 200, vibration generated when oscillation unit 100 oscillates laser L is transferred only up to first connection part 410, without being transferred to second connection part 420 that is separated from first connection part 410.

That is, vibration generated by oscillation unit 100 is interrupted by connection unit 400, thereby not being transferred to shutter unit 200 connected with connection unit 400, so vibration generated by oscillation unit 100 is prevented from being transferred to optical unit 300 by the medium of shutter unit 200. Accordingly, an error does not occur in the guide of light path LP of laser L that is oscillated by oscillation unit 100, by optical unit 300.

In addition, in laser oscillation device 102 constructued as the second exemplary embodiment, because first and second connection parts 410 and 420 of connection unit 400 are supported by oscillation unit 100 and shutter unit 200, respectively, in the state in which they are separated from each other, mechanical stress transferred to connection unit 400 or to shutter unit 200 can be lessened to restrain damage to connection unit 400 or shutter unit 200.

A laser oscillation device constructed as a third exemplary embodiment according to the principles of the present invention will now be described with reference to FIG. 6.

Figure 6:
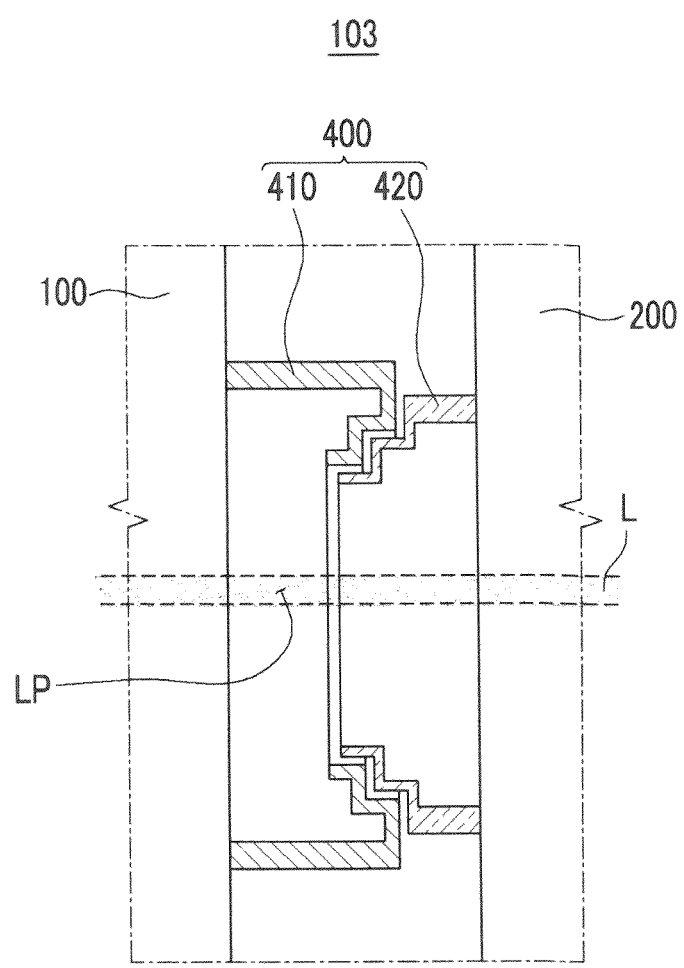
FIG. 6 is a cross-sectional view showing a portion of a laser oscillation device constructed as a third exemplary embodiment according to the principles of the present invention.

FIG. 6 a cross-sectional view showing a portion of a laser oscillation device 103 constructued as the third exemplary embodiment.

As shown in FIG. 6, connection unit 400 of laser oscillation device 103 constructued as the third exemplary embodiment includes first and second connection parts 410 and 420.

First and second connection parts 410 and 420 are supported by oscillation unit 100 and shutter unit 200, respectively. First connection part 410 covers a portion or the entirety of second connection part 420 in a state in which first connection part 410 is separated from second connection part 420. First and second connection parts 410 and 420 have shapes that structurally correspond to each other, and extend in a stepwise fashion.

First connection part 410 of laser oscillation device 103 constructued as the third exemplary embodiment is configured to cover second connection part 420, but the present invention is not limited thereto. That is, in a different embodiment, connection unit 400 may be configured such that second connection part 420 covers first connection part 410.

As described above, in laser oscillation device 103 constructued as the third exemplary embodiment, because second connection part 420 covers first connection part 410 in the state of being separated from first connection part 410, and first connection part 410 of connection unit 400 is connected with oscillation unit 100 and second connection part 420 is connected with shutter unit 200, vibration generated by oscillation unit 100 can be prevented from being transferred to optical unit 300 by the medium of shutter unit 200.

In addition, in laser oscillation device 103 constructued as the third exemplary embodiment, because first and second connection parts 410 and 420 of connection unit 400 are supported by oscillation unit 100 and shutter unit 200, respectively, in the state in which they are separated from each other, mechanical stress transferred to connection unit 400 or to shutter unit 200 can be lessened to restrain damage to connection unit 400 or shutter unit 200.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A laser oscillation device, comprising:
an oscillation unit oscillating a laser;
a shutter unit covering the laser; and
a connection unit covering the laser, connecting the oscillation unit and the shutter unit, and comprising a first connection part supported by the oscillation unit and a second connection part supported by the shutter unit,
the first and second connection parts being separated from each other with a space between the first and second parts, and one of the first and second connection parts covering at least a portion of the other one of the first and second connection parts,
wherein the first and second connection parts do not come in contact with each other with no intervening structure or material between the first and second connection parts,
wherein the first connection part comprises a first extension portion extending in a first cylindrical shape from the oscillation unit toward the shutter unit, and the second connection part comprises a second extension portion extending from the shutter unit to an interior of the first extension portion, and having a second cylindrical shape with a smaller diameter than that of the first extension portion in the first cylindrical shape, and
wherein the first connection part further comprises a first bent portion bent to extend from an end portion of the first extension portion toward the second extension portion, and the second connection part further comprises a second bent portion bent to extend from an end portion of the second extension portion toward the first extension portion, wherein the first and second bent portions face each other.

2. The device of claim 1, further comprising an optical unit connected with the shutter unit and changing a light path of the laser.

3. The device of claim 2, further comprising:
a first support supporting the oscillation unit; and
a second support supporting at least one of the shutter unit and the optical unit,
the first and second supports being separated from each other.

4. The device of claim 3, wherein the first and second connection parts have shapes that structurally correspond to each other.

5. The device of claim 4, wherein,
the first connection part comprises a third extension portion extending in a third cylindrical shape from the oscillation unit toward the shutter unit, and
the second connection part comprises a fourth extension portion extending from the shutter unit toward the third extension portion to cover the third extension portion and having a fourth cylindrical shape with a larger diameter than that of the third extension portion in the third cylindrical shape.

6. A laser oscillation device, comprising:
an oscillation unit oscillating a laser;
a shutter unit covering the laser;
a connection unit covering the laser, connecting the oscillation unit and the shutter unit, and comprising a first connection part supported by the oscillation unit and a second connection part supported by the shutter unit, the first and second connection parts being separated from each other with a space between the first and second parts, and one of the first and second connection parts covering at least a portion of the other one of the first and second connection parts, the first and second connection parts do not come in contact with each other with no intervening structure or material between the first and second connection parts;
an optical unit connected with the shutter unit and changing a light path of the laser
a first support supporting the oscillation unit; and
a second support supporting at least one of the shutter unit and the optical unit, the first and second supports being separated from each other,
wherein the first and second connection parts have shapes that structurally correspond to each other,
wherein the first connection part comprises a third extension portion extending in a third cylindrical shape from the oscillation unit toward the shutter unit, and the second connection part comprises a fourth extension portion extending from the shutter unit toward the third extension portion to cover the third extension portion and having a fourth cylindrical shape with a larger diameter than that of the third extension portion in the third cylindrical shape, and
wherein the first connection part further comprises a third bent portion bent to extend from an end portion of the third extension portion toward the fourth extension portion, and the second connection part further comprises a fourth bent portion bent to extend from an end portion of the fourth extension portion toward the third extension portion, wherein the third and fourth bent portions face each other.

7. A laser oscillation device, comprising:
an oscillation unit oscillating a laser;

a shutter unit covering the laser;

a connection unit covering the laser, connecting the oscillation unit and the shutter unit, and comprising a first connection part supported by the oscillation unit and a second connection part supported by the shutter unit, the first and second connection parts being separated from each other with a space between the first and second parts, and one of the first and second connection parts covering at least a portion of the other one of the first and second connection parts, the first and second connection parts do not come in contact with each other with no intervening structure or material between the first and second connection parts;

an optical unit connected with the shutter unit and changing a light path of the laser a first support supporting the oscillation unit; and a second support supporting at least one of the shutter unit and the optical unit, the first and second supports being separated from each other, wherein the first and second connection parts have shapes that structurally correspond to each other, and wherein the first and second connection parts extend in a stepwise fashion.

8. The device of claim 1, wherein the laser is an excimer layer.

9. The device of claim 8, wherein the laser is used to crystallize silicon.

* * * * *